(12) United States Patent
Checka et al.

(10) Patent No.: US 7,480,879 B2
(45) Date of Patent: Jan. 20, 2009

(54) SUBSTRATE NOISE TOOL

(75) Inventors: Nisha Checka, Cambridge, MA (US); Anantha Chandrakasan, Belmont, MA (US); Rafael Reif, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 256 days.

(21) Appl. No.: 11/400,424

(22) Filed: Apr. 7, 2006

(65) Prior Publication Data

US 2007/0067747 A1  Mar. 22, 2007

Related U.S. Application Data

(60) Provisional application No. 60/718,471, filed on Sep. 19, 2005.

(51) Int. Cl.
*G06F 17/50* (2006.01)
(52) U.S. Cl. .................. 716/5; 716/4; 716/6; 703/14; 703/15; 703/16
(58) Field of Classification Search ............. 716/3–6; 703/14–16
See application file for complete search history.

(56) References Cited

U.S. PATENT DOCUMENTS

| 6,291,322 | B1 * | 9/2001 | Clement ............... 438/510 |
| 6,941,258 | B2 * | 9/2005 | Van Heijningen et al. ..... 703/16 |
| 6,986,113 | B2 * | 1/2006 | Sinha et al. ............... 716/4 |
| 7,039,536 | B2 * | 5/2006 | Nagata et al. ............ 702/70 |
| 7,197,446 | B2 * | 3/2007 | Breiland et al. .......... 703/14 |
| 2002/0022951 | A1 * | 2/2002 | Heijningen et al. ....... 703/16 |

OTHER PUBLICATIONS

A design experiment for measurement of the spectral content of substrate noise in mixed-signal integrated circuits Van Heijningen, M. et al. "A design experiment for measurement of the spectral content of substrate noise in mixed-signal integrated circuits", 1999. SSMSD '99. 1999 Southwest Symposium on Apr. 11-13, 1999 pp. 27-32.*

(Continued)

*Primary Examiner*—Jack Chiang
*Assistant Examiner*—Naum B Levin
(74) *Attorney, Agent, or Firm*—Nields & Lemack

(57) ABSTRACT

System and method for analyzing substrate noise is disclosed, which is capable of accepting inputs of increasing complexity and granularity. During the early phases, the tool can accept coarse circuit descriptions, such as gate level netlists. The tool is capable of generating rudimentary substrate models based on estimated die size, allowing the designer to have an early indication of potential substrate noise issues. During the middle phases, the tool can accept more accurate circuit descriptions, such as a SPICE netlist. A more detailed substrate model can be generated, which considers layout information, thereby allowing the designer to make layout and circuit modifications before the circuit is completed. Lastly, during final verification, the tool can accept an even more accurate netlist, such as a SPICE netlist that includes parasitic capacitance. The tool can also accept a more detailed substrate model and provides the substrate noise analysis necessary to finalize the design.

12 Claims, 6 Drawing Sheets

OTHER PUBLICATIONS

IEEE; Roberto Rossi et al.; "Model and Verification of Triple-Well Shielding on Substrate Noise in Mixed-Signal CMOS Ics"; pp. 643-646.

IEEE Journal of Solid-State Circuits vol. 36, No. 3, Mar. 2001; Min Xu et al.; "Measuring and Modeling the Effects of Substrate Noise on the LNA for a CMOS GPS Receiver"; pp. 473-485.

IEEE; Proceeding of HDP'04; Li-Rong Zheng et al.; "Design and Implementation of System-on-Package for Radio and Mixed-Signal Applications"; pp. 97-104.

IEEE Transactions on Electron Devices, vol. 51, No. 11, Nov. 2004; Joyce H. Wu et al.; "A Through-Wafer Interconnect in Silicon for RFICs" pp. 1765-1771.

IEEE Journal of Solid-State Circuits, vol. 33 No. 3, Mar. 1998; Nishath K. Verghese et al.; "Computer-Aided Design Considerations for Mixed-Signal Coupling in RF Integrated Circuits"; pp. 314-323.

IEEE Journal of Solid-State Circuits, vol. 37 No. 12 Dec. 2002; Paul van Zeijl et al.; "A Bluetooth Radio in 0.18-um CMOS"; pp. 1679-1687.

IEEE Journal of Solid-State Circuits, vol. 28, No. 4, Apr. 1993; David K. Su, et al.; "Experimental Results and Modeling Techniques for Substrate Noise in Mixed-Signal Integrated Circuits"; pp. 420-430.

IEEE; C.Soens et al.; "Performance degradation of an LC-tank VCO by impact of digital switching noise"; pp. 119-122.

IEEE; ISCAS 2004; Joao M. S Silva et al.; Multigrid-based Substrate Coupling Model Extraction; pp. V-169-172.

IEEE 1995 Custom Integrated Circuits Conference; Sujoy Mitra et al.; "A Methodology for Rapid Estimation of Substrate-Coupled Switching Noise"; pp. 129-132.

IEEE 1996 Custom Integrated Circuits Conference; Paolo Miliozzi et al.; "SubWave: a methodology for Modeling digital substrate Noise Injection in Mixed-Signal Ics"; pp. 385-388.

IEE Proc.-Comput. Digit. Tech., vol. 150, No. 5, Sep. 2003; F. Martorell etal.; "Modelling and evaluation of substrate noise induced by interconnects"; pp. 338-345.

Electronics Letters Sep. 16, 1999 vol. 35, No. 19; Tingyang Liu et al.; "Active Substrate Coupling Noise Reduction method for ICS" pp. 1633-1634.

IEEE; ICMTS 03; Simon Kristiansson et al.; "Substrate Resistance Modeling for Noise Coupling Analysis"; pp. 124-129.

Electronics Letters May 23, 1996, vol. 32 No. 11; E. Albuquerque et al.; "NMOS Current-Balanced Logic" pp. 997-998.

IEEE Transactions on Electron Deviceds, vol. 44, No. 12, Dec. 1997; Jean-Pierre Raskin et al.; "Substrate Crosstalk Reduction Using SOI Technology"; pp. 2252-2261.

IEEE Journal of Solid-State Circuits, vol. 33, No. 6, Jun. 1998; Alan L. L. Pun et al.; "Substrate Noise Coupling Through Planar Spiral Inductor"; pp. 877-884.

IEEE Journal of Solid-State Circuits, vol. 39, No. 11, Nov. 2004; Mark Shane Peng et al.; "Study of Substrate Noise and Techniques for Minimization"; pp. 2080-2086.

2003 Symposium on VLSI Circuits Digest of Technical Papers; Mark Shane peng et al.; "Study of Substrate Noise and Techniques for Minimization"; pp. 197-200.

2000 IEEE International Solid-State Circuits Conference; TP13.6; Makoto Nagata et al.; "Reduced Substrate Noise Digital Design for Improving Embedded Analog Performance"; 3-Pages.

IEEE Journal of Solid-State Circuits, vol. 40, No. 2, Feb. 2005; Albert Jerng et al.; "The Impact of Device Type and Sizing on Phase Noise Mechanisms" pp. 360-369.

IEEE Journal of Solid-State Circuits, vol. 29, No. 10, Oct. 1994; Kuntal Joardar; "A Simple Approach to Modeling Cross-Talk in Integrated Circuits"; pp. 1212-1219.

IEEE 2004 Custom Integrated Circuits Conference; Simon Kristiansson etal.; "A Surface Potential Model for Predicting Substrate Noise Coupling in Integrated Circuits"; pp. 497-500.

IEEE Journal of Solid-State Circuits, vol. 32, No. 7, Jul. 1997; Mark Ingels et al.; "Design Strategies and Decoupling Techniques for Reducing the Effects of Electrical Interference in Mixed-Mode IC's"; pp. 1136-1141.

DAC'04, Jun. 7-11, 2004, 50.3; G.Van der Plas et al.; "High-Level Simulation of Substrate Noise in High-Ohmic Substrates with Interconnect and Supply Effects"; pp. 854-859.

IEEE; Luis Elvira et al.; "A Macromodelling Methodoloyg for Efficient High-Level Simulation of Substrate Noise Generation"; 2-Pages.

IEEE; 2002 Symposium On VLSI Circuits Digest of Technical Papers; L.M. Franca-Neto et al.; "Enabling High-Performance Mixed-Signal System-on-a-Chip (SoC) in High Performance Logic CMOS Technology"; pp. 164-167.

26.2; Marc van Heijningen, et al.; "High-Level Simulation of Substrate Noise Generation Including power Supply Noise Coupling"; pp. 446-451.

IEEE 2005; Nisha Checka et al.; "The Effect of Substrate Noise on VCO Performance"; pp. 4-Pages.

1995 IEEE International Solid-State Circuits Conference; Tallis Blalack et al.; "The Effects of Switching Noise on an Oversampling A/d Converter" pp. 200-201/367.

IEEE 2005 Custom Integrated Circuits Conference; Nisha Checka et al.; Substrate Noise Analysis and Experimental Veritification of the Efficient Noise Prediction of a Digital PLL; pp. 473-476.

IEEE BCTM 12.1; Tallis Blalack et al.; "On-chip RF Isolation Techniques"; pp. 205-211.

IEEE 2004 Custom Integrated Circuits Conference; Mustafa Badaroglu et al.; "Impact of Technology Scaling on Substrate Noise Generation Mechanisms"; pp. 501-504.

ISSCC 2002/Session 16/High speed 1/0/ 16.6; Mustafa Badaroglu et al.; "Methodology and Experimental Verification for Substrate Noise Reduction in CMOS Mixed0-Signal Ics with Synchronous Digital Circuits"; 3-Pages.

27.5; Mustafa Badaroglu et al.; "Clock Tree Optimization in Synchronous CMOS digital Circuits for Substate Noise Reduction Using Folding of Supply Current Transients"; pp. 399-404.

2001 IEEE; Mustafa Badaroglu et al.; "High-Level Simulation of Substrate Noise Generation from large Digital Circuits with Multiple Supplies"; pp. 326-330.

ISSCC 2005/Session 17/RF Cellular Ics/ 17.1; Debapriya Sahu et al.; "A 90nm CMOS single-Chip GPS Receiver with 5dBm Out-of-Band IIP3 2.0dB NF"; pp. 308-309/600.

2004 IEEE; Shahab Ardalan et al.; "An Overview of Substrate Noise Reduction Techniques"; 6-pages.

IEEE Journal of Solid-State Circuits, vol. 38, No. 7, Jul. 2003; Mustafa Badarohglu et al.; "Modeling and Experimental Verification of Substrate Noise Generation in a 220-Kgates WLAN System-on-Chip With Multiple Supplies"; pp. 1250-1260.

ISSCC 2002/ Session 3/Digital signal processors and Circuit / 3.6; David Redmond et al.; "A GSM/CPRS Mixed-Signal Baseband IC"; 3-Pages.

IEEE Journal of Solid-State Circuits, vol. 39, No. 9, Sep. 2004; Behzad Razavi; "A Study of Injection Locking and Pulling in Oscillators"; pp. 1415-1424.

\* cited by examiner

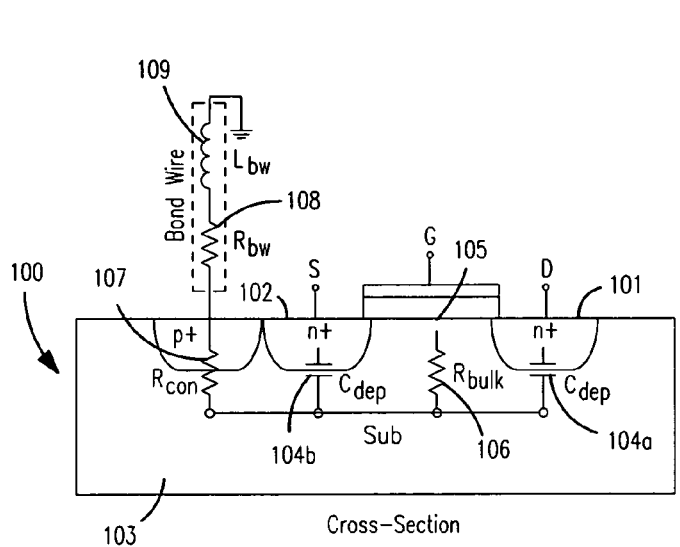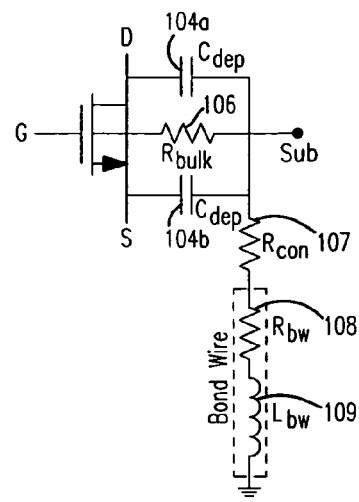
FIG. 1a  FIG. 1b
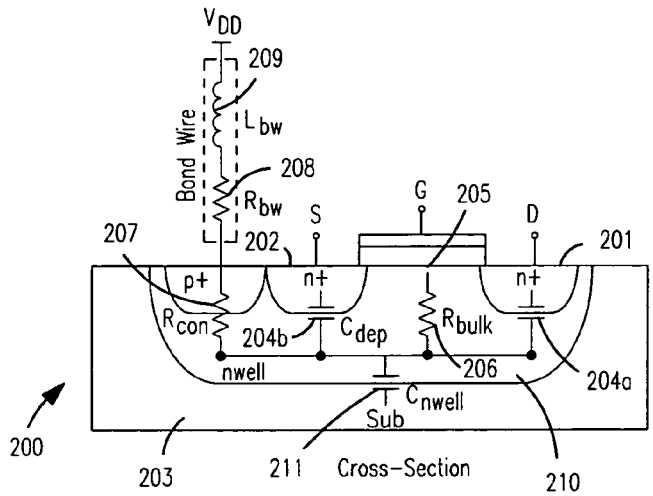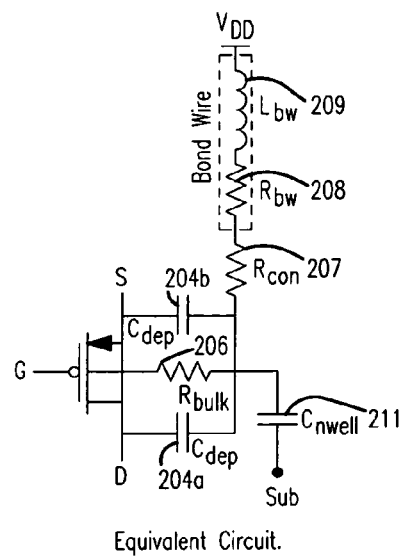
FIG. 2a  FIG. 2b

SUBSTRATE NOISE TOOL

This application claims priority of U.S. Provisional application No. 60/718,471 filed Sep. 19, 2005, the disclosure of which is incorporated herein by reference.

BACKGROUND OF THE INVENTION

With the increasing levels of integration in today's integrated circuits and ever-increasing digital circuit speeds, the problem of substrate noise is more and more pronounced. The performance of sensitive analog circuits can be severely degraded by excessive substrate noise. The effect of substrate noise on the circuits within an IC is typically observed during the testing phase only after the chip has been fabricated. However, this is often too late, for if the substrate noise negatively impacts the performance of the circuit, the circuit must be laid out again and re-fabricated. This consumes valuable time and money. Therefore, a determination of substrate noise coupling during the design phase would be extremely beneficial to circuit designers who can incorporate the effect of the noise and re-design accordingly before fabrication. This would reduce the turn around time for circuits and prevent costly redesign.

Work in the area of pre-fabrication substrate noise modeling and analysis falls into several categories. The first is the simulation of digital circuits to determine the substrate noise generated. To be able to manage the substrate noise problem, the need for simulation to predict substrate noise performance is becoming more evident.

Standard techniques to simulate expected substrate noise tend to be either accurate but extremely inefficient, or fast but rather inaccurate. Noise macromodelling approaches fall in between these two ends of the spectrum. The inefficient techniques are accurate because all noise sources, coupling, and propagation mechanisms are well modeled; however, this leads to a large number of nodes in the simulation model. This excessive number of nodes accounts for the temporal inefficiency. These techniques involve simulating a large number of nonlinear devices in order to accurately model the noise current profiles. In contrast, the fast techniques rely on the random nature of the noise generated. These techniques assume that if the number of gates is large enough and if the global switching activity is uniformly distributed over a large portion of the spectrum, the noise can be modeled as a single Gaussian white or pink noise source. Approximating the noise as a Gaussian source captures only a small portion of the entire energy spectrum. Thus, detrimental noise components are often omitted or grossly underestimated.

The second category concerns modeling the substrate itself. Most work on substrate noise falls into this category. Different approaches to accurately model the substrate typically result in an extremely large mesh of passives. Much work has focused on techniques to reduce the substrate netlist to a more manageable form while maintaining accuracy. Accurate substrate modeling is a very complex problem. However, more rudimentary substrate models were developed to permit extremely fast substrate simulations at the expense of some accuracy.

The final category of work and also the least developed is in the area of examining the effect of substrate noise on analog circuits. Most of the efforts have focused on low frequency circuits such as A/D converters. Most work on radio frequency (RF) circuits has been limited to low noise amplifiers. There are at least two existing approaches to substrate noise simulation. The first is a full transistor level methodology to simulate for substrate noise. As described above, this approach yields the most accurate data, however it can be both time and computation intensive. The second approach uses noise macromodels to decrease the time required to perform the simulation.

FIG. 1(a) shows the cross-section of an NMOS device 100 and the elements that are added to model injection into the substrate. The traditional NMOS device 100 comprises a drain region 101 and a source region 102; implanted into a substrate 103. These source and drain regions are capacitively coupled to the substrate 103 through the depletion capacitances 104. These nonlinear capacitances depend on the source and drain voltages, according to the following equation:

$$Cj = AC_{JA}/(1-V/\Phi_B)^{mA} + PC_{JSW}/(1-V/\Phi_B)^{mSW} \qquad (1)$$

Where
A=Area
$C_{JA}$=Zero bias area junction capacitance
V=Bias across junction
$\Phi_B$=Junction potential
$M_A$=Area Grading Coefficient
P=Perimeter
$C_{JSW}$=Zero bias sidewall junction capacitance
and $m_{SW}$=Sidewall Grading Coefficient Because of this dependence on voltage, these capacitances will vary over time if the outputs are switching.

The bulk node 105 of the device is resistively connected to the local substrate node through a resistance 106 given by the equation given below. ρ is the resistivity of the channel region. For an epi substrate, T is the thickness of the epi layer. For a non-epi substrate, T is roughly the junction depth. L and W correspond to the junction's length and width, respectively.

$$R_{bulk} = \rho T/LW \qquad (2)$$

The final element that is added to account for coupling into the substrate 103 is the resistance of the substrate contact 107, which is connected to ground through a bond wire. A series resistance 108 and inductance 109 is used to model the bond wire impedance. The amount of noise that couples through the substrate contact 107 can be quite significant. Typically the source 102 is shorted to the substrate contact to prevent any threshold voltage fluctuation. In doing so, switching currents work in tandem with the impedance associated with the ground line to create ground bounce. This node is resistively connected to the substrate resulting in most of the ground bounce appearing on the substrate itself.

FIG. 1(b) shows all of these passive elements introduced in the circuit. Therefore, to properly model injection into the substrate, these four additional elements (source depletion capacitance 104b, drain depletion capacitance 104a, the bulk resistance 106 and the substrate contact resistance 107) must be added to each NMOS device. In most circuits, a simplification is possible, since the source is connected to the same ground as the substrate contact 107 thus shorting out the source depletion capacitance 104b. In this case, only three additional elements need to be added to each NMOS device.

FIG. 2(a) shows the cross-section of a PMOS device 200 and the elements that are added to model injection into the substrate. The elements that must be added to a PMOS device 200 are similar to those added to an NMOS device 100, except an additional term to model the n-well 210 must be incorporated. All elements of the PMOS device 200 that are equivalent to the NMOS device 100 are shown with similar reference designators. Specifically, the two lower digits of the reference designator are the same. Thus, the bulk resistance of the NMOS device is designated as 106, while the bulk resistance of the PMOS device is designated as 206. These additional elements are shown in FIGS. 2(*a*) and 2(*b*).

The expression for the depletion capacitance 204 is roughly the same, except signs are changed to compensate for the PMOS nature. The expression for $R_{bulk}$ 206 is given in equation (2) is the same for the PMOS device 200 except the resistivity is now the resistivity of the n-well 210. The substrate contact 207 for the PMOS is connected to VDD through bondwires. The local substrate node 205, however, is shielded from the substrate by the n-well 210. This is modeled with a resistance 206 through the n-well 210 and a capacitance 211 representing the n-well junction capacitance.

For each PMOS device, six additional elements are required to model noise injection into the substrate. However, for most circuits, the source 202 is connected to the same power supply as the substrate contact 207, thereby shorting out the depletion capacitance 204*b*. This results in only five additional elements needed to model the injection for a PMOS device.

The following example is used to illustrate the complexity of this approach. FIG. 3 shows the equivalent circuit for a single CMOS inverter, including the additional passive components needed to model the substrate noise. Similar reference numbers are used to correspond to elements illustrated in FIGS. 1 and 2.

To predict the noise injected by a single CMOS inverter, the elements described above need to be added to the inverter circuit to account for injection into the substrate. The circuit in the dashed box 300 of FIG. 3 represents the inverter with the additional elements to model injection into the substrate, as described in conjunction with FIGS. 1 and 2. For such a simple circuit, an additional eight nodes (located within dashed box 300) have to be simulated with a combination of nonlinear and linear devices to determine the noise injected into the substrate.

The circuit elements in dashed box 301 represent the model for the substrate at low frequencies. Additional nodes have to be simulated in order to model propagation in the substrate. For example, resistors 302 through 309 are added to represent the resistance through the substrate. This resistor network is obviously dependent on the physical size of the substrate, as well as the number of elements in the circuit. From this simple example, it is apparent that the additional elements that have to be added to model for substrate noise increase rapidly with the size of the circuit.

The circuit in dashed box 310 is the model for a substrate contact used to probe the substrate noise.

Consider a medium-scale circuit with approximately one million devices. Based on the simple example shown above, to model injection into the substrate, an additional four million passive elements must be added to the circuit. Thus, in order to predict the noise injected, a simulation of one million nonlinear devices and four million passive elements has to be performed. To properly model propagation within the substrate itself, yet more elements must be added. Because the complexity of the circuit scales rapidly with circuit size, the simulation time will be excessively long and in many cases will not converge.

As described above, transistor level simulation techniques result in prohibitively long simulation times. If the noise behavior could be abstracted to a higher level while still preserving the relationship to the substrate, simulation times could be reduced. One way of accomplishing this is to extract the switching behavior of the digital circuit and to use mathematical models to calculate the substrate noise. In one embodiment, a behavioral model based on a modeling tool, such as AnalogHDL, is used. Switching transitions from the modeling tool, such as AnalogHDL, together with mathematical expressions for the substrate noise are used to predict the substrate noise profile. Because mathematical expressions instead of real waveforms are used to generate the noise profiles, this methodology yields less accurate predictions of the substrate noise. Furthermore, with technology scaling, mathematical models used to model transistor behavior are becoming more complex. Because this technique relies on the ability of the mathematical expressions to model the substrate noise behavior, its accuracy will further diminish for future technology nodes.

Another technique that abstracts the noise behavior is macromodelling. In order for the macromodels to still yield accurate results, the noise behavior of the circuit has to be completely encapsulated. This involves not only accurately modeling injection into the substrate but also accurately modeling the switching noise.

Noise macromodelling approaches fall into two categories. Several of these methodologies are input dependent and follow a similar flow. These approaches are based on the superposition of patterns and current profiles to generate the noise signature. Noise waveforms at critical nodes are determined based on user-supplied I/O vectors. Switching elements are typically simplified using linear macromodels that mimic the switching behavior of the original circuit. These techniques generate an equivalent circuit similar to that shown in FIG. 4. Each, however, uses a different noise macromodel.

These approaches yield very good accuracy with reasonable simulation times. The main limitation of the macromodelling technique is that determining the worst case noise behavior of the circuit can be a formidable task. Multiple simulations over different input conditions have to be performed.

Substrate noise analysis has also been done using input independent simulation. One such methodology relies on power dissipation data from a system-level power estimator to predict the substrate noise profile. In that embodiment, substrate coupling from interconnects and source/drain diffusion regions were assumed to be negligible compared to VDD and ground noise. More and more digital systems are interconnect dominated, and in such circuits, the noise contribution from interconnect can be significant. However, this assumption was valid for small scale circuits where the role of the interconnect was not important. Because only power supply noise was considered, examining the power dissipation permitted the prediction of current transients that dissipated the power. This methodology determined RMS contours of the substrate noise that represent the average amount of noise at any point on the substrate. This technique cannot be used to examine the time varying nature of the substrate noise or to determine the frequency content of the noise. Knowing only an estimate of the peak substrate noise value without knowing its frequency content is not entirely useful. The purpose of determining the noise profile is to be able to design appropriate isolation structures and to determine the effect of that noise on any analog circuits that are integrated with the digital system. For example, if a narrowband RF circuit is to be integrated with a particular digital system, only the noise generated in band is of interest. Without knowing the frequency content, the severity of the substrate noise problem cannot be assessed. Furthermore, the amount of attenuation afforded by isolation structures is frequency dependent. Without knowing what frequencies should be targeted, the isolation structure design will not be optimized. Therefore, this technique can only be used to generate a rough estimate of the noise and thus is most useful for floorplanning.

In summary, each of the methodologies used in the prior art has at least one shortcoming that impacts its effectiveness. A full SPICE transistor level simulation yields the most accurate results; however, it is impractical for most circuits as the run-time increases rapidly with circuit complexity. For typical circuits, full transistor level simulations require several weeks to simulate a few clock cycles and often do not converge. Approaches that employ macromodels are also known in the prior art and significantly reduce simulation time. However, each macromodel approach has its own shortcomings. The most common problem is that the noise macromodel does not completely encapsulate the noise behavior of the original circuit. Furthermore, certain assumptions inherent in specific tools do not permit the tool for use with non-epi substrates. With technology scaling, latch-up is becoming less of a concern; thus, non-epi substrates are becoming more prevalent for their improved noise isolation properties over epi substrates. Several other prior art methodologies use a substrate model generated by SubstrateStorm, a tool available from Cadence. SubstrateStorm requires a full layout of the circuit with a substrate doping profile. Because a full layout is required, substrate noise simulation can only be performed at the end of the design cycle.

Furthermore, there exist several tools that can be used to predict the substrate noise profile of digital systems. However, none of these are flexible enough to work at any stage in the design cycle. Specifically, these tools can only be used for final verification. Final verification of the substrate noise performance of a digital system is an important part of substrate coupling analysis. However, a tool that can yield information at earlier stages in the design cycle permits changes in both the design and the layout to try to mitigate noise coupling and, thus, performs a much more valuable function. Such a tool should be able to work at higher abstraction levels to tradeoff accuracy for simulation speed. Additionally, the tool should be able to work at various granularity levels to tradeoff simulation speed for accuracy. This would allow the tool to be useful during various stages of IC design.

SUMMARY OF THE INVENTION

The problems of the prior art have been overcome using a software program and method for analyzing substrate noise, using a range of input information. Briefly, a substrate noise analysis tool is disclosed. This tool is capable of accepting inputs of increasing complexity and granularity, thus making the tool suitable for employment during all phases of IC design. During the early stages of design, the tool can accept coarse circuit descriptions, such as gate level netlists. The design tool is capable of generating rudimentary substrate models based on estimated die size. Using these inputs, a relatively fast simulation can be performed, allowing the designer to have an early indication of potential substrate noise issues. During the middle stages of design, the tool can accept more accurate circuit descriptions, such as a SPICE netlist. A more detailed substrate model, which considers layout information, can be generated. This simulation produces a more accurate representation of the substrate noise, thereby allowing the designer to make layout and circuit modifications if necessary before the circuit is completed. Lastly, during final verification, the tool can accept an even more accurate netlist, such as a SPICE netlist that includes parasitics. The tool can also accept a substrate model generated either by this design tool, or another substrate modeling tool, such as SubstrateStorm. The simulation based on these inputs is far more accurate than those above, and provides the substrate noise analysis necessary to allow the designer to determine whether the circuit should be fabricated.

BRIEF DESCRIPTION OF THE DRAWINGS

FIG. 1(a) is a cross section of an NMOS device;
FIG. 1(b) is the equivalent circuit of the NMOS device of FIG. 1(a);
FIG. 2(a) is a cross section of a PMOS device;
FIG. 2(b) is the equivalent circuit of the PMOS device of FIG. 2(a)

DETAILED DESCRIPTION

Figure 3:
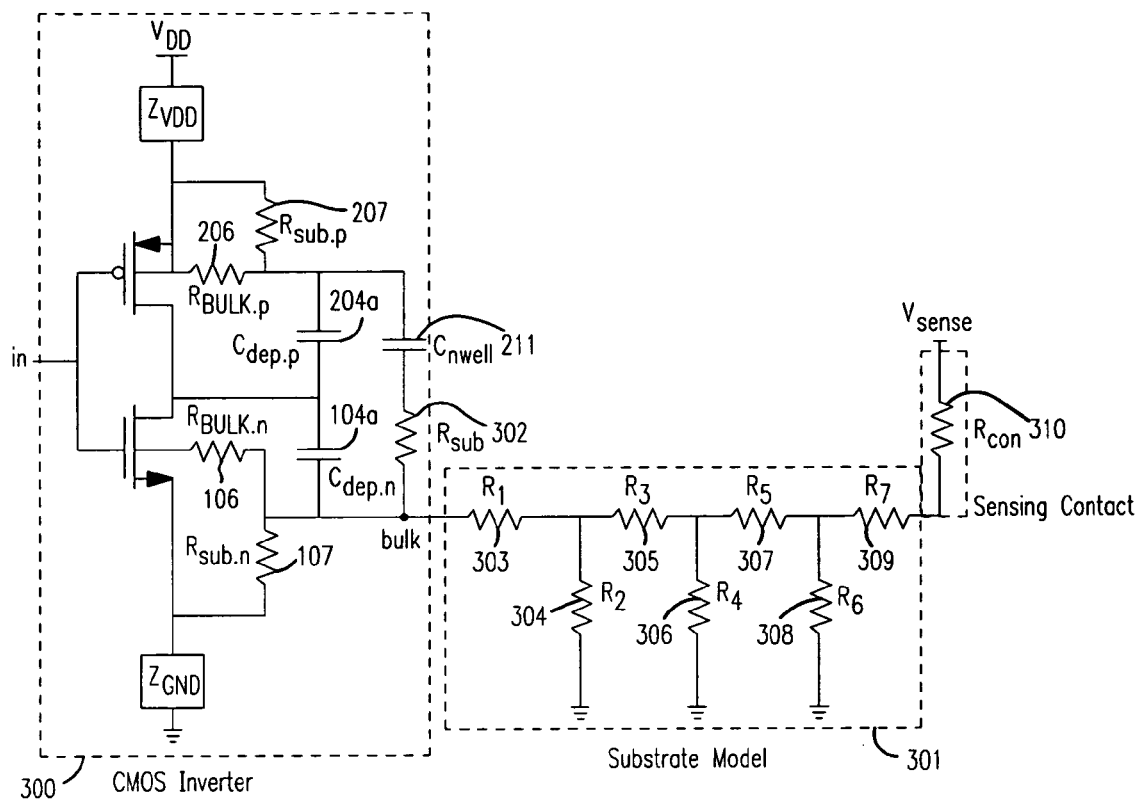
FIG. 3 is the equivalent circuit for a CMOS inverter.
Figure 4:
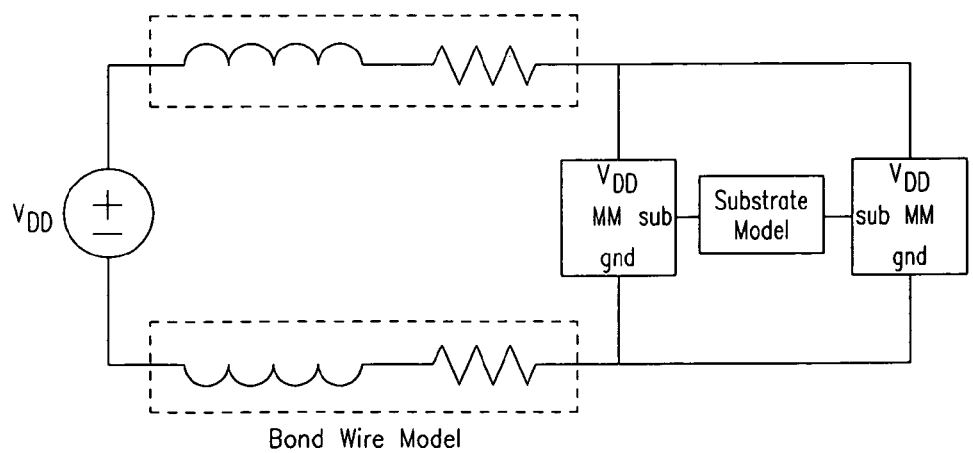
FIG. 4 is a representative circuit generated by macromodelling techniques.
Figure 5:
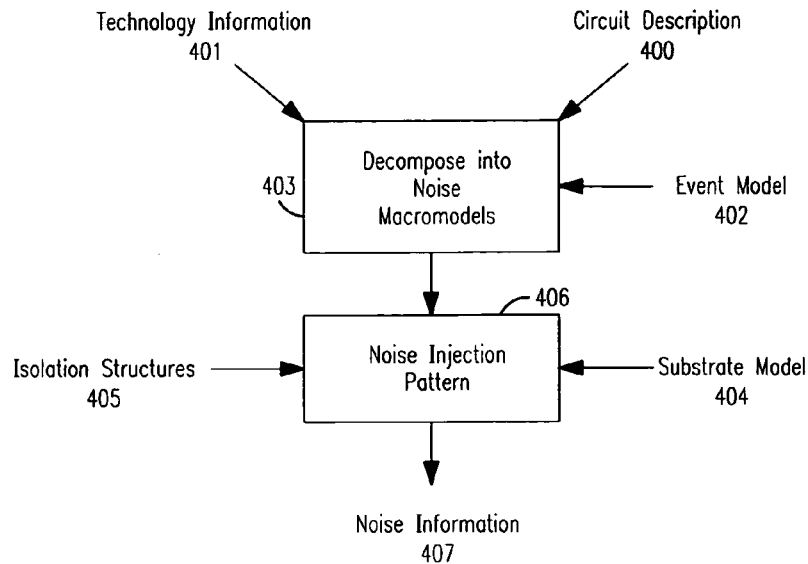
FIG. 5 is the simulation flow of the software program.

FIG. 5 illustrates a high-level block diagram showing the operation of the software program, which is written in Perl, although other computer languages are within the scope of the invention.

The software program requires several sets of input information: circuit information 400, technology information 401, an event model 402, optionally a substrate model 404, and optionally information concerning the isolation structures 405. Using the first two sets of information, the software program decomposes the circuit into equivalent noise macromodels 403. The noise macromodels together with the event model 402 for each node in the circuit are used to construct the noise signature 406. This noise signature 406 is then simulated with the substrate model 404 and power grid/isolation structures 405 to compute the substrate noise profile. The outputs 407 are a time domain representation and noise spectrum. Each of these components is described in more detail below.

As shown in FIG. 5, to generate the noise signature, the software program requires information about the circuit. In one embodiment, a gate level description accompanied by BSIM (Berkeley Short-channel IGFET Models) can be used to generate the noise signature 406. There are a number of hardware description languages (HDLs), available from numerous vendors, such as Verilog, that can be used to generate the required circuit description. A Verilog simulation is fast; however, the event model generated is less accurate than SPICE. As a result, accuracy is compromised. Typically, if the starting netlist is at the gate level, no layout information is available.

Figure 6:
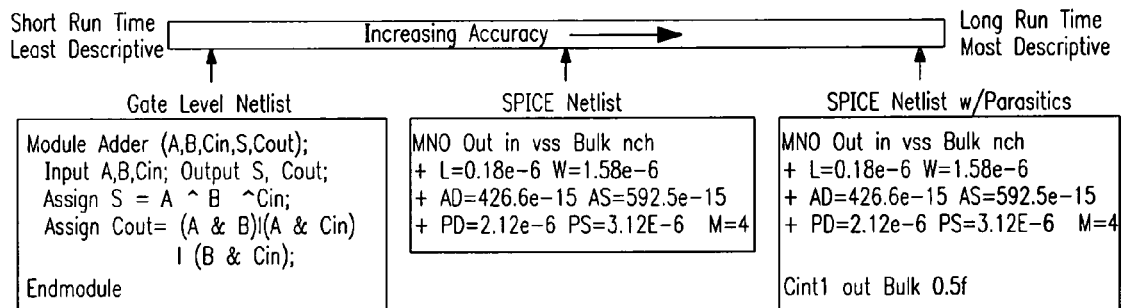
FIG. 6 is a diagram depicting the differing levels of input specificity that can be utilized by the software program.

FIG. 6 depicts the increasing levels of granularity and specificity that can be used as the circuit description input to the software program.

At the far left is the gate level netlist, using HDL, as described above. As can be seen, the input is in the form of a gate level netlist, where the input is described in terms of logical functions, such as AND, OR, NOT, and XOR. As a matter of illustration, the box above shows the inputs associated with a simple adder. In this scenario, there are two inputs (A and B), and a carry in ($C_{in}$), and two outputs: the sum (S), and the carry out ($C_{out}$). Physical characteristics of the circuit are provided, however rise and fall times are not accurately represented. In addition, the simulation engine used is less accurate than the one employed in the SPICE tool. Therefore, this type of input can be simulated quickly, but the accuracy of the result will suffer due to the less accurate event model.

In the center of the spectrum is a netlist, which can be created using a number of tools, such as SPICE. SPICE is a powerful general-purpose analog circuit simulator that is used to verify circuit designs and to predict the circuit behavior. There are numerous variations of this simulator available from a variety of vendors. This netlist decomposes the gate level circuit description into individual devices, such as NMOS or PMOS transistors. As a matter of illustration, the box above shows a single NMOS transistor, having a drain connection (out), a gate connection (in), a source connection (vss), and a bulk connection (bulk). In addition to defining the interconnections between the various elements, the netlist specifies various physical parameters, such as the length (L) and width (W) of the gate, and the area and perimeter of the source region (AS and PS, respectively) and the area and perimeter of the drain region (AD and PD, respectively). A more detailed circuit description, such as this type of netlist that is extracted from the layout, increases the number of elements that are simulated and thus the simulation time. However, the accuracy of the result is improved as compared to the result using the gate level netlist.

At the far right side of FIG. 6 is a netlist, such as a SPICE netlist, complete with information on circuit parasitics. This netlist has all of the elements of the previously described extracted netlist, including length (L) and width (W) of the gate, and the area and perimeter of the source region (AS and PS, respectively) and the area and perimeter of the drain region (AD and PD, respectively). In addition, parasitic capacitance is included. As shown in the above example, a parasitic capacitor is included between the drain and the bulk region to more accurately represent the actual behavior of the circuit. As expected, this type of circuit description provides the most detail and therefore yields the most accurate result. However, it also requires the greatest amount of time to simulate.

Each of these types of circuit descriptions is well known to those skilled in the art, and easily generated.

A second input required by the software program, as illustrated in FIG. 5, is the substrate model of the integrated circuit 404. To properly model the high resistivity, non-epi substrate that is typically used in mixed-signal systems, a full extraction of the layout of the circuit with the substrate doping profile is typically generated. Most substrate noise analysis tools require this very detailed substrate model, which can be generated by certain design tools, such as Cadence's SubstrateStorm.

Figure 7:
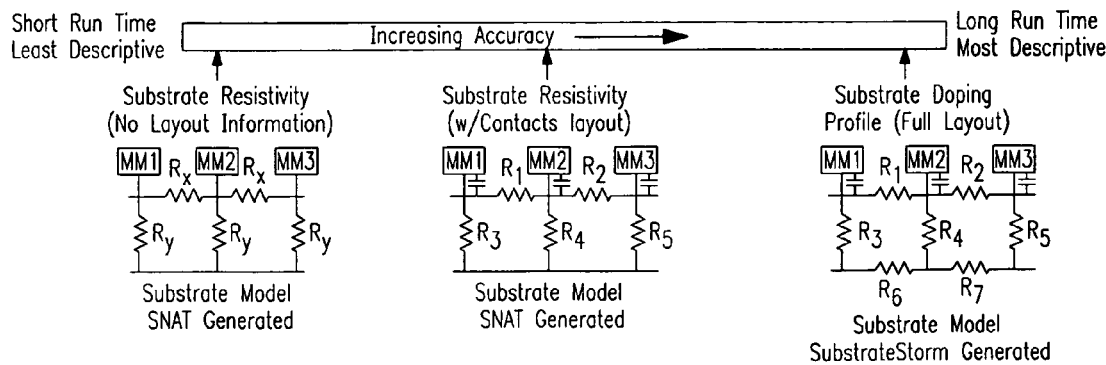
FIG. 7 is a diagram depicting the levels of complexity of the substrate model.

As depicted in FIG. 7, on the right side of the spectrum, the use of a detailed substrate model, such as is generated by SubstrateStorm, generates the most accurate result. However, this accuracy is at the expense of increased simulation time. Depending on the size of the circuit, the generated netlist can be very large, since all propagation mechanisms are accounted for. Thus, it is not unusual for the resulting netlist to include several million elements. Simulation times that require several days to complete are not uncommon for medium-sized circuits. Such lengthy simulation times can be tolerated for final verification; however, they are prohibitively long if the simulation is performed during the design phase.

If the technology is not well characterized, such that substrate doping profiles are unknown, or the lengthy simulation times are unacceptable, SubstrateStorm cannot be used. In many prior art approaches, if SubstrateStorm was unavailable, it would be impossible to generate a substrate noise profile.

The software program, also referred to as Substrate Noise Analysis Tool (SNAT), overcomes this limitation by being able to utilize other types of substrate models. Additionally, SNAT can generate its own substrate model.

As shown at the far left side of the spectrum in FIG. 7, there are times early in the design process when there may not be any layout information available. For example, if the circuit description at this stage of the design process is a Verilog netlist, no layout information is available. Despite this deficiency, SNAT is still able to generate a substrate model. In this case, an estimate of the circuit area is provided, from which an equi-resistance mesh is generated. The user supplies two pieces of information from which SNAT is able to generate a substrate model: the die size and the substrate resistivity. The die is then divided into discrete subsections, such as of equal area. The area of these subsections is not fixed, and in one embodiment, is based on the die size. In one embodiment, each subsection is defined as 100 µm by 100 µm. However, smaller subsections are possible, especially for smaller die sizes. The resistance within a particular subsection may be assumed to be negligible. The resistance between discrete subsections is based on the distance between the subsections and the substrate resistivity, and is defined as $\rho L/A$, where $\rho$ is the resistivity, L is the length between points and A is the cross sectional area of the die. In addition, in one embodiment, calculated resistances greater than a certain threshold, such as 0.5 M$\Omega$, can be ignored. In this model, since no layout information is provided, the placement of the substrate contacts is assumed to be uniformly distributed across the die. As would be expected, this approximation yields the fastest simulation time, however it generates the least accurate results.

In the center of the spectrum is a more accurate substrate model based only on the underlying substrate resistivity. Thus, the capacitive effects of wells and other junctions are ignored. Typically, these effects need only be considered at low frequencies. Therefore, at higher frequencies, a purely resistive model can be used to approximate the behavior of the substrate.

The user supplies the substrate resistivity and the layout. To generate this purely resistive model, the software program utilizes the layout information for the circuit. The software finds each substrate contact location using the netlist, and determines its relative position within the layout. In one embodiment, the layout is provided in CIF (Caltech Intermediate Format) format. Using this data, SNAT is able to generate a mesh of resistances between the various substrate contact points, where the resistance values are related to the actual layout. This model has fewer nodes than the full SubstrateStorm model, thereby reducing simulation time. SNAT utilizes layout information to determine the appropriate resistive components between substrate contact points, using the equation given above, $\rho L/A$. Thus, the amount of layout detail has an effect on the accuracy of the resulting substrate model. Similarly, reductions in layout detail decrease the number of elements in the substrate model and therefore reduce the associated simulation time.

Referring again to FIG. 5, the software program, SNAT, uses the technology information and circuit description to generate noise macromodels. These macromodels are used in place of devices to determine substrate noise. As described earlier, the use of noise macromodels is well known. The software program utilizes the idea of macromodels, but increases their accuracy by accounting for all noise sources.

Figure 8:
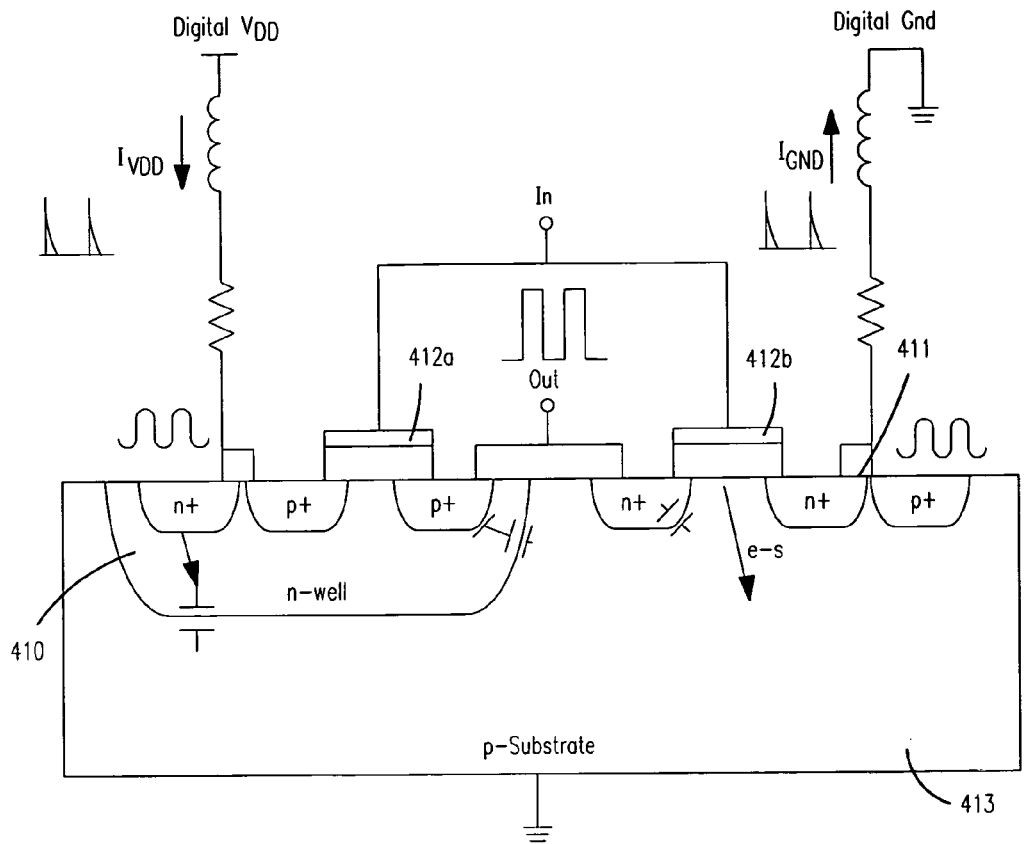
FIG. 8 is a cross section of a CMOS inverter.

FIG. 8 is a cross section of a simple CMOS inverter. As is customary, the PMOS device 410 is connected to the power supply, $V_{dd}$, while the NMOS device 411 is connected to ground. The gates 412a, 412b are each connected to the inverter's input.

Figure 9:
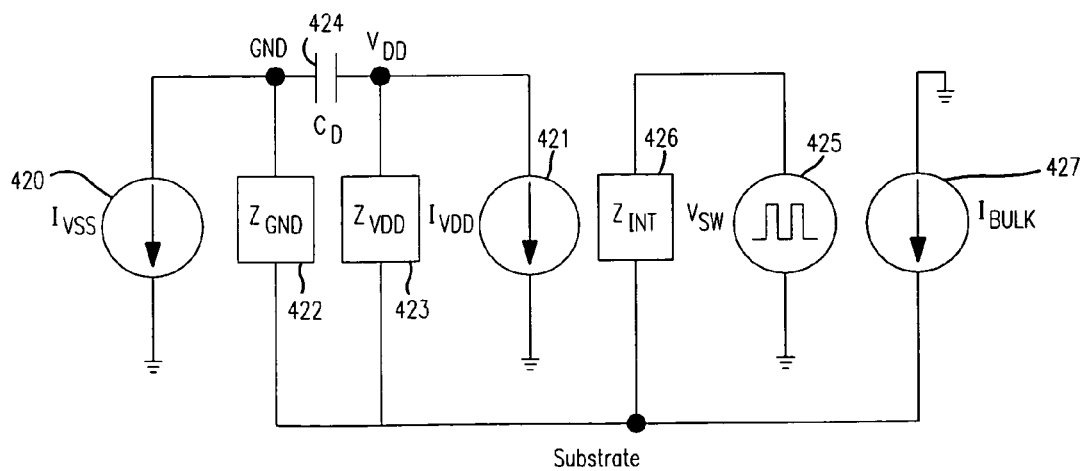
FIG. 9 is the noise macromodel used by the tool.

FIG. 9 represents the noise macromodel used to represent a gate. The current sources $I_{VDD}$ 421 and $I_{VSS}$ 420 represent the noise in the power and ground lines, respectively. These currents, working in tandem with package parasitics, will create VDD and ground bounce that appear on the substrate 413. $Z_{GND}$ 422 and $Z_{VDD}$ 423 represent the equivalent impedance from ground and VDD, respectively to the substrate. For example, for a simple n-well process, $Z_{GND}$ would simply be the resistance of the substrate contact, $R_{sub}$. This substrate contact resistance was described earlier in relation to SPICE modeling. Similarly, $Z_{VDD}$ would be the series combination of the n-well capacitor and the resistance through the n-well. $C_D$ 424 represents the impedance local to the gate between VDD and ground.

Modeling the impedance from the both VDD and ground to substrate as simple lumped elements is an approximation that is valid up to several GHz. Earlier tests have shown that the lumped model in the macromodel loses its validity around 5 GHz for an inverter.

$I_{bulk}$ 427 represents current flowing directly into the substrate such as that from impact ionization. In one embodiment, $I_{bulk}$ 427 is extracted from an HSPICE simulation of the particular standard cell. The voltage source $V_{sw}$ 425 is used to represent the capacitive sources of noise such as interconnect. $V_{sw}$ 425 is a voltage switching waveform. The event simulation that is performed supplies the necessary information to derive $V_{sw}$. $Z_{int}$ 426 is used to represent the impedance from the capacitive sources of noise and the substrate, specifically between an interconnect line and the substrate. The addition of elements 425, 426 and 427 is a significant difference between the macromodel proposed here and that of other prior art approaches. Earlier work showed that medium-sized interconnects can couple more noise into the substrate than several hundred switching transistors. However, the complex routing of the interconnect mesh does create a shielding effect that mitigates the amount of noise that is coupled. Nevertheless, in some situations, certain interconnects can induce significant levels of substrate noise. For example, interconnect associated with clock networks is used to distribute a high-speed signal using wide metal traces that can have significant capacitance to substrate. In addition, the effect of bond pads and pad rings can be significant. Other approaches neglect this source of noise resulting in reduced accuracy when compared to measured data. The current noise sources 420, 421 and 427 in the macromodel are dependent on both the input rise time and output load of the particular device.

Figure 10:
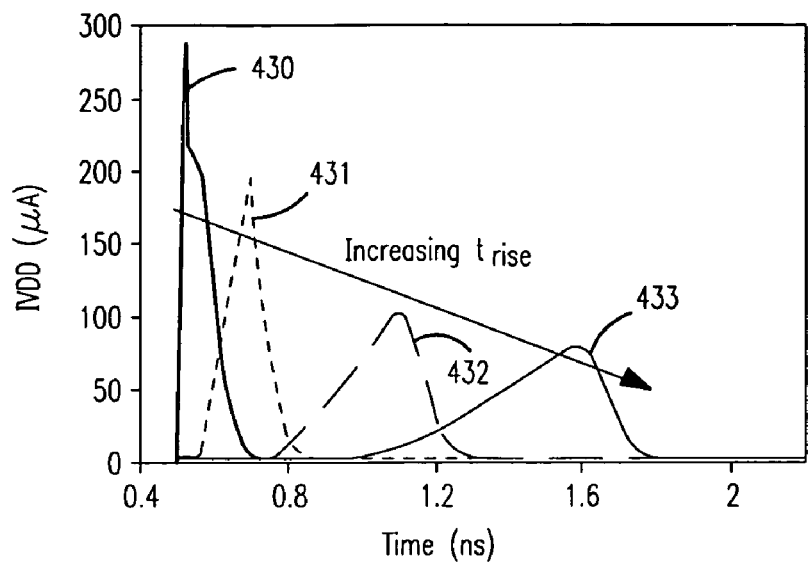
FIG. 10 illustrates a typical dependence of input rise time on noise current.

Since the current noise sources 420, 421 and 427 in the noise macromodel depend on the input rise time and the output load capacitance, these relationships need to be determined as part of the library characterization. FIG. 10 shows a representative set of graphs showing the IVDD current as a function of time for input rise times of increasing magnitude. For example, graph 430 shows a current peak of nearly 300 µA with a duration of less than 0.8 ns. In contrast, graph 431 has a peak of roughly 200 µA, of roughly equal duration. However, the beginning of the peak is offset in time by about 0.2 ns as compared to graph 430. Graphs 432 and 433 show that as the input rise time continues to increase, the current peak continues to diminish, the start of the peak is further delayed, and its duration is extended. Thus, knowing the rise time of the input to a particular cell is critical to accurately modeling the current noise sources.

Figure 11:
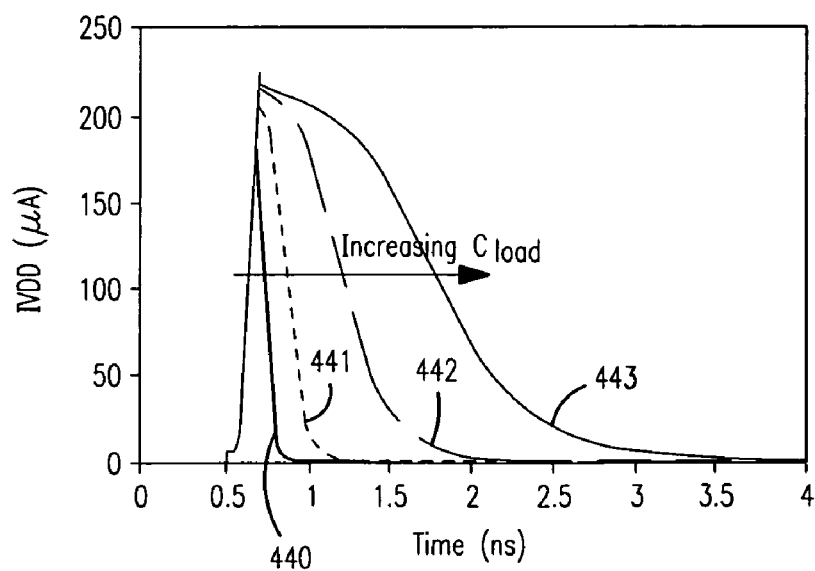
FIG. 11 illustrate a typical dependence of output capacitive load on noise current.

Similarly, FIG. 11 demonstrates the effect of output load capacitance on supply current. Although the peak value of the current is not significantly impacted by output load capacitance, the duration of the pulse clearly is. Graph 440 shows that for low output load capacitance, the duration of the pulse is about 0.3 ns. Graph 443 shows that for high output load capacitance, the pulse duration can be in excess of 2 ns. Values load capacitance between these extremes yield graphs between 440 and 443, such as graphs 441 and 442. Thus, knowing the output load capacitance of a particular cell is critical to accurately modeling the current noise sources.

Figure 12:
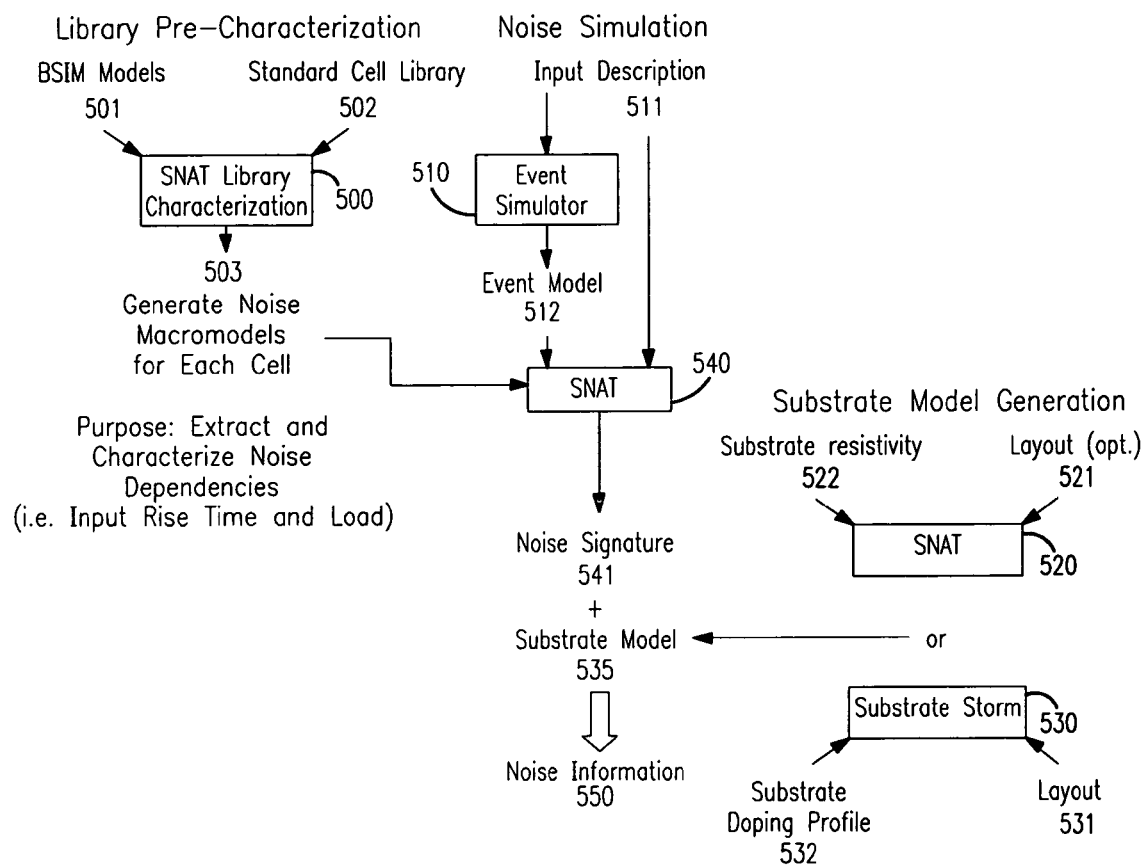
FIG. 12 represents the detailed methodology used by the software program.

Having defined many of the inputs and several of the required parameters needed for SNAT, the overall methodology will be described. FIG. 12 illustrates the various steps required to generate substrate noise analysis.

In Box 500, a characterization of the devices used in the particular technology library is performed. During the library characterization, the software program characterizes each of the standard cells 502 and generates equivalent noise macromodels 503. Referring to FIG. 9, the noise macromodel includes several current sources, and several impedances. These values are all determined during this characterization step 500. This extracted library information represents the technology information 401, shown in FIG. 5.

In order to extract the noise current source profiles 420, 421, and 427, simulations, such as can be done using SPICE, are performed over all possible input combinations, and the resultant profiles are stored. In addition, the dependencies on input rise time and output capacitive load are also extracted using SPICE. These values are stored, and are used, in conjunction with the event model, to create noise current sources 420, 421 and 427. These dependencies are specific to the type of cell and will vary between cells. For example, the dependence of current on input rise time for an inverter will differ from that of a NAND gate.

In one embodiment, a set of output load values, greater than 10, ranging from 0 fF (femtoFarads) to 100 fF, is used to extract the dependence of peak and pulse width on the load value. Other ranges are also possible and within the scope of the invention. Similarly, the dependence on rise time is extracted by simulating using a set of rise time values. In one embodiment, the rise time values range from 0.004 ns to 1.6 ns, although other ranges are possible.

Equivalent impedances are also computed in the characterization step 500. $Z_{gnd}$ 422 is typically the resistance of the p+ substrate contact for an NMOS device in an n-well process. Similarly, $Z_{Vdd}$ is the series combination of the n-well capacitance and the resistance of the n+ substrate contact. These values are computed based on the geometry of each device and the on resistance and capacitance data provided in the BSIM model file 501.

The capacitance between $V_{dd}$ and ground, $C_d$ 424, is extracted from an AC simulation of the cell, such as can be performed using HSPICE.

All of the above information is stored, such as in a look-up table, which is accessible during the substrate noise simulation. This library characterization is performed only once for a particular technology library and is completely independent of the circuit description.

$Z_{int}$ and $V_{sw}$ cannot be characterized during the library characterization step because they are dependent on the circuit itself.

The impedance from the switching interconnect to the substrate is represented by $Z_{int}$. $Z_{int}$ is typically a series resistance and capacitance. For example, to incorporate the effect of a switching signal connected to an output pad, Zint is a series capacitance representing the pad-to-substrate capacitance and a resistance representing a spreading resistance. In one embodiment, Zint is calculated using an external parasitic extraction program, several of which are known to those skilled in the art.

As stated above, $V_{sw}$ is a switching waveform. The event simulation that is performed later supplies all of the necessary information to construct this waveform.

The second part of the methodology involves creating the noise signature of the particular circuit under test. The circuit description 511, such as provided by Verilog HDL or another modeling language, is used as the input. The SNAT tool generates the noise signature 541 utilizing both the circuit description 511 and the event model 512, which is created by the event simulator. SNAT 540 receives the circuit description and converts all of the cells into their equivalent noise macrocells, as defined in the library characterization. Recall that noise macrocells are a combination of impedances and noise current sources. The impedances, as described above, are independent of the circuit used. However, the noise current sources are dependent on the circuit topology (which affects parameters such as input rise time and output load) and the event simulation (since noise results predominantly only when nodes are switched).

To create these noise current sources, as well as $V_{sw}$, an event model 512 must be created by simulating the circuit. If the circuit description is a gate level netlist, the event simulator 510 is a gate level simulator. If the circuit description is a SPICE netlist, the event simulator 510 is a simulation tool such as HSPICE or Nanosim. This event driven simulation is performed on the full system to determine the rise and fall times of each node and the state of all modes at each point in time. This information creates the event model 512. SNAT extracts the switching events of each node of the circuit. This event information, together with the look-up table generated during the library characterization, is used to construct the noise current waveforms for each macromodel.

This procedure is repeated for each of the cells in the design. At the completion of this step, the noise signature 541, which includes all of the noise macromodels, with their associated equivalent impedances and noise current profiles, is defined.

This noise signature must be combined with a substrate model 535 to generate the required substrate noise information 550. As described earlier, the software program can accept a substrate model generated by SubstrateStorm 530, which incorporates the circuit layout 531 and the substrate doping profile 532. Alternatively, SNAT 520 can generate a substrate model, based on the substrate resistivity 522 and optionally, the circuit layout 521. The resulting substrate model 535 is then merged with the noise macromodels generated in step 540.

This combined model is then simulated, using a tool such as SPICE to compute the substrate noise information 550. SNAT determines both the time domain noise and the noise spectrum.

Optionally, as shown in FIG. 5, isolation structure information 405 can be input into the noise macromodels. In one embodiment, the user specifies the isolation geometry and distance, and SNAT generates the resultant substrate noise information 407.

In addition, the package in which the circuit is to be housed plays an important role in the generated noise profile. To account for this, the user may enter a package model. For example, a bond wire is typically modeled as a series resistor and inductance. Optionally, decoupling capacitance, added to the circuit board can also be used to the model to show its effect on the substrate noise of the integrated circuit.

What is claimed:

1. A method for analyzing the substrate noise of an integrated circuit at any point during the design cycle, wherein said integrated circuit comprises a plurality of standard cells, comprising:
    creating a noise macrocell for each of said standard cells, wherein the plurality of created noise macrocells comprises a noise model;
    simulating said integrated circuit to generate an event model;
    creating a model of said substrate, by performing the steps of:
        receiving from a user an estimated die size and a substrate resistivity;
        dividing said die size into equal sized partitions;
        assuming equal distribution of substrate contacts between said partitions;
        calculating the resistance between each pair of partitions based on the distance between said pair and said inputted resistivity; and
        creating a resistive mesh network using said calculated resistances; and
    simulating said substrate model and said noise model using said event model to create a profile of said substrate noise.

2. The method of claim 1, wherein said integrated circuit comprises at least one power line, one ground line, and one interconnect, wherein said noise macrocell is created comprising components selected from the group consisting of current sources representing noise in said power line, current sources representing noise in said ground line, current sources representing noise injected into said substrate, the impedance between said substrate and said ground line, the impedance between said substrate and said power line, the local impedance between said power line and said ground line, and the impedance between said interconnect and said substrate.

3. The method of claim 2, further comprising the step of creating a library of characterized noise macrocells, wherein said characterization comprises the steps of:
    simulating each of said current sources using a plurality of different input rise times; and
    simulating each of said current sources using a plurality of different output load capacitances.

4. A system for analyzing the substrate noise of an integrated circuit at any point during the design cycle, wherein said integrated circuit comprises a plurality of standard cells, said system comprising:
    a computer readable device; and computer executable instructions stored on said device, comprising:
    means for creating a noise macrocell for each of said standard cells wherein the plurality of created noise macrocells comprises a noise model;
    means for simulating said integrated circuit to generate an event model;
    means for creating a model of said substrate, comprising
        means for receiving from a user an estimated die size and a substrate resistivity;
        means for dividing said die size into equal sized partitions;
        means for assuming equal distribution of substrate contacts between said partitions;

means for calculating the resistance between each pair of partitions based on the distance between said pair and said inputted resistivity; and means for creating a resistive mesh network using said calculated resistances; and means for simulating said substrate model and said noise model using said event model to create a profile of said substrate noise.

5. The system of claim 4, wherein said integrated circuit comprises at least one power line, one ground line, and one interconnect, wherein said noise macrocell is created comprising components selected from the group consisting of current sources representing noise in said power line, current sources representing noise in said ground line, current sources representing noise injected into said substrate, the impedance between said substrate and said ground line, the impedance between said substrate and said power line, the local impedance between said power line and said ground line, and the impedance between said interconnect and said substrate.

6. The system of claim 4, further comprising means for creating a library of characterized noise macrocells, wherein said means for characterization comprises:

means for simulating each of said current sources using a plurality of different input rise times; and means for simulating each of said current sources using a plurality of different output load capacitances.

7. A method for analyzing the substrate noise of an integrated circuit at any point during the design cycle, wherein said integrated circuit comprises a plurality of standard cells, comprising:

creating a noise macrocell for each of said standard cells, wherein the plurality of created noise macrocells comprises a noise model;

simulating said integrated circuit to generate an event model;

creating a model of said substrate, by performing the steps of:

inputting a circuit layout and the substrate resistivity;

determining the location of each substrate contact based on said layout;

calculating the resistance between each pair of substrate contacts based on the distance between said pair and said inputted resistivity; and creating a resistive mesh network using said calculated values; and simulating said substrate model and said noise model using said event model to create a profile of said substrate noise.

8. The method of claim 7, wherein said integrated circuit comprises at least one power line, one ground line, and one interconnect, wherein said noise macrocell is created comprising components selected from the group consisting of current sources representing noise in said power line, current sources representing noise in said ground line, current sources representing noise injected into said substrate, the impedance between said substrate and said ground line, the impedance between said substrate and said power line, the local impedance between said power line and said ground line, and the impedance between said interconnect and said substrate.

9. The method of claim 8, further comprising the step of creating a library of characterized noise macrocells, wherein said characterization comprises the steps of:

simulating each of said current sources using a plurality of different input rise times; and simulating each of said current sources using a plurality of different output load capacitances.

10. A system for analyzing the substrate noise of an integrated circuit at any point during the design cycle, wherein said integrated circuit comprises a plurality of standard cells, said system comprising:

a computer readable device; and computer executable instructions stored on said device, comprising:

means for creating a noise macrocell for each of said standard cells wherein the plurality of created noise macrocells comprises a noise model;

means for simulating said integrated circuit to generate an event model;

means for creating a model of said substrate, comprising:

means for inputting a circuit layout and the substrate resistivity;

means for determining the location of each substrate contact based on said layout;

means for calculating the resistance between each pair of substrate contacts based on the distance between said pair and said inputted resistivity; and means for creating a resistive mesh network using said calculated values; and means for simulating said substrate model and said noise model using said event model to create a profile of said substrate noise.

11. The system of claim 10, wherein said integrated circuit comprises at least one power line, one ground line, and one interconnect, wherein said noise macrocell is created comprising components selected from the group consisting of current sources representing noise in said power line, current sources representing noise in said ground line, current sources representing noise injected into said substrate, the impedance between said substrate and said ground line, the impedance between said substrate and said power line, the local impedance between said power line and said ground line, and the impedance between said interconnect and said substrate.

12. The system of claim 10, further comprising means for creating a library of characterized noise macrocells, wherein said means for characterization comprises:

means for simulating each of said current sources using a plurality of different input rise times; and means for simulating each of said current sources using a plurality of different output load capacitances.

* * * * *